United States Patent
Peake et al.

(10) Patent No.: US 8,357,971 B2
(45) Date of Patent: Jan. 22, 2013

(54) TRENCH GATE MOSFET AND METHOD OF MANUFACTURING THE SAME

(75) Inventors: Steven Thomas Peake, Warrington (GB); Philip Rutter, Stockport (GB); Christopher Martin Rogers, Manchester (GB); Miron Drobnis, Manchester (GB); Andrew Butler, Jilin (CN)

(73) Assignee: NXP B.V., Eindhoven (NL)

(*) Notice: Subject to any disclaimer, the term of this patent is extended or adjusted under 35 U.S.C. 154(b) by 137 days.

(21) Appl. No.: 12/739,341

(22) PCT Filed: Oct. 22, 2008

(86) PCT No.: PCT/IB2008/054355
§ 371 (c)(1),
(2), (4) Date: Sep. 7, 2010

(87) PCT Pub. No.: WO2009/057015
PCT Pub. Date: May 7, 2009

(65) Prior Publication Data
US 2010/0320532 A1 Dec. 23, 2010

(30) Foreign Application Priority Data
Oct. 29, 2007 (EP) .................................. 07119506

(51) Int. Cl.
*H01L 29/66* (2006.01)
*H01L 29/78* (2006.01)
(52) U.S. Cl. ................ 257/330; 257/333; 257/E29.201; 257/E29.26
(58) Field of Classification Search .................. 257/330, 257/333, E29.201, E29.26
See application file for complete search history.

(56) References Cited

U.S. PATENT DOCUMENTS

| 4,754,310 | A | 6/1988 | Coe |
| 5,998,833 | A | 12/1999 | Baliga |
| 2002/0125529 | A1 | 9/2002 | Zeng |
| 2004/0188756 | A1 | 9/2004 | Matsuda |
| 2004/0195618 | A1* | 10/2004 | Saito et al. .................... 257/330 |
| 2006/0157779 | A1* | 7/2006 | Kachi et al. .................. 257/330 |
| 2006/0214221 | A1 | 9/2006 | Challa et al. |

(Continued)

FOREIGN PATENT DOCUMENTS

| DE | 10 2004 024661 A1 | 12/2005 |
| EP | 1170803 A2 | 9/2002 |

(Continued)

OTHER PUBLICATIONS

Rochefort, C., et al; "A Scalable Trench Etch Based Process for High Voltage Vertical Reurf MOSFET's"; Proceeding From the 17th Intl Symposium Power Semiconductor Development & ICS; Santa Barbara, CA, US; 4 Pages; (May 2005).

(Continued)

*Primary Examiner* — Jerome Jackson, Jr.
*Assistant Examiner* — Paul Budd (57) ABSTRACT

A Trench gate MOS field-effect transistor having a narrow, lightly doped, region extending from a channel accommodating region (3) of same conductivity type immediately adjacent the trench sidewall. The narrow region may be self-aligned to the top of a lower polysilicon shield region in the trench or may extend the complete depth of the trench. The narrow region advantageously relaxes the manufacturing tolerances, which otherwise require close alignment of the upper polysilicon trench gate to the body-drain junction.

11 Claims, 8 Drawing Sheets

U.S. PATENT DOCUMENTS

| | | |
|---|---|---|
| 2007/0040214 A1 | 2/2007 | Zeng |
| 2007/0069324 A1 | 3/2007 | Takaishi |
| 2007/0082441 A1 | 4/2007 | Kraft et al. |
| 2007/0190712 A1* | 8/2007 | Lin et al. ............... 438/197 |

FOREIGN PATENT DOCUMENTS

| | | |
|---|---|---|
| WO | 00/33386 A | 8/2000 |
| WO | 0213257 A2 | 2/2002 |
| WO | 2005/065385 A2 | 7/2005 |
| WO | 2005/053032 | 9/2005 |
| WO | 2005/096389 A | 10/2005 |

OTHER PUBLICATIONS

Gajda, M.A., et al; "Industrilization of Resurf Stepped Oxide Technology for Power Transistors"; Proceeding 18th Intl Symposium Power Semiconductor Development & ICS; Naples, Italy; 4 Pages (Jun. 2006).

Koops, G.E.J., et al; "Resurf Stepped Oxide (RSO) MOSFET for 85V Having a Record-Low Specific on-Resistance"; Proceedings of 2004 Intl Symposium on Power Semiconductor Devices & ICS; Kitakyushu; 4 Pages (2004).

\* cited by examiner

TRENCH GATE MOSFET AND METHOD OF MANUFACTURING THE SAME

FIELD OF THE INVENTION

This invention relates to Trench Field Effect Transistors (FET) and in particular to TrenchFETs which have a separate source region within the trench isolated from the gate region within the trench.

BACKGROUND OF THE INVENTION

TrenchFETs are a class of metal oxide semiconductor (MOS) devices wherein the channel between the source and drain of the device runs vertically, under the control of a gate electrode. The gate electrode is accommodated in a trench within the device and isolated from the semiconductor layers typically by gate oxide lining the side-walls and base of the trench.

Such devices typically have an n-type source region adjacent the surface of the device, beneath which lies a p-type body region (which accommodates the channel). Beneath the p-type body region is the n-type drain region. A trench in the device, the side walls of which are lined with gate oxide, provides access for the gate electrode to the body region, in order to provide a channel within the body region. In operation, application of a potential to the gate electrode opens the channel in the body region and allows electrical conduction between the source and drain regions.

The design of all TrenchFETs incorporate an area of trench where the gate electrode is exposed to the drain. Where the gate electrode is exposed to the drain a gate/drain capacitor is formed. The magnitude of the gate/drain capacitance is dependent upon the area of the gate exposed. For fast switching devices it is beneficial to reduce the gate/drain capacitance as much as possible for the following reasons: firstly, to reduce the switching loss per cycle; secondly, to reduce the total gate charge, and thirdly to improve the gate's immunity by maximising the reverse breakdown parameter (BVdso).

One method of reducing the gate/drain capacitance is the RESURF (REduced SURface Field) stepped oxide concept. A schematic representation of such a device is shown in FIG. 1.

Figure 1:
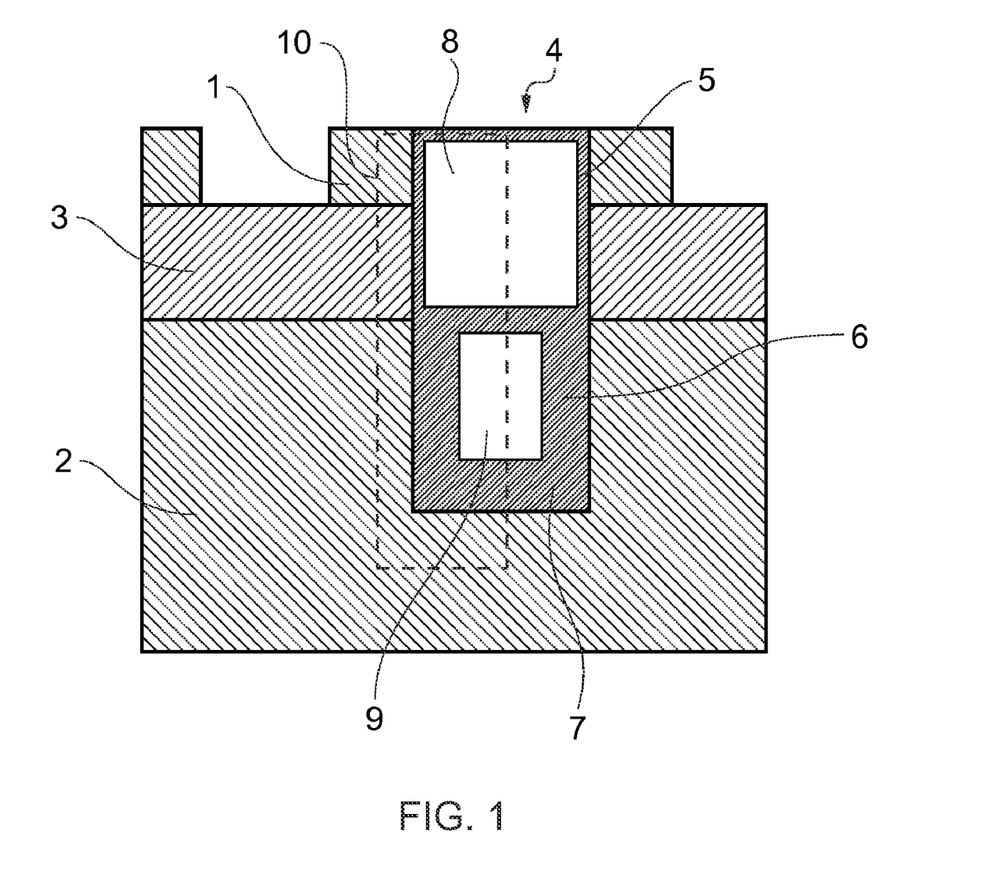
FIG. 1 shows a schematic cross section through part of a known TrenchFET device.

FIG. 1 depicts part of a semiconductor device having source region 1 and drain region 2 between which is a body region 3. Typically source region 1 and drain region 2 are n-type semiconductor, and body region 3 is p-type semiconductor. The device is characterised by a trench, generally depicted by 4, which extends from the top surface into the device, through the source region and body region and into the drain region. The trench is lined with oxide adjacent to the side walls 5 and 6 and the bottom 7. The upper part of the trench is filled with gate electrode 8. The gate electrode 8 typically comprises polysilicon material. Deeper in the trench than the gate electrode 8, and electrically isolated from it, is a further region typically of polysilicon material, designated as shield electrode 9. As depicted in FIG. 1, the shield electrode generally lies further from the side walls of the trench, than does the gate electrode. The shield electrode, which is electrically isolated from the gate electrode but typically connected to the source electrode, has the effect of shielding the gate electrode from the drain region. However, this is only effective if the distance between the body/drain junction and the bottom of the gate electrode is small, as is apparent from FIG. 1. As the distance increases the level of shielding provided by the shield electrode reduces.

There is therefore an ongoing need for a TrenchFET which provides the benefit of the RESURF stepped oxide concept, but does not suffer from the close tolerances involved in aligning the bottom of the gate electrode with the body/drain junction.

SUMMARY OF THE INVENTION

It is an object of the present invention to provide a semiconductor device which provides the benefit of the RESURF stepped oxide concept but does not suffer from the tight tolerance requirements as outlined above. In accordance with the present invention there is provided a trench field effect transistor (TrenchFET) comprising a semiconductor body defining a first major surface, a first and a second region of a first conductivity type, a channel-accommodating third region therebetween of a second conductivity type opposite the first conductivity type, a trench extending from the first major surface into the semiconductor body, adjacent the first and channel-accommodating third regions and extending into the second region, a gate formed of electrically conducting material within the trench and spaced apart from the sidewalls and bottom of the trench, a shield region formed of electrically conducting material within the trench and between the gate and bottom of the trench and spaced apart therefrom, characterised in that the TrenchFET further comprises a fourth region of the second conductivity type adjacent the sidewalls of the trench and extending from the channel-accommodating third region towards the bottom of the trench. Beneficially, the device provides for relaxed manufacturing tolerances, particularly as regards the alignment of the bottom of the gate electrode with the body/drain junction.

Preferably, the fourth region has a doping level which is lower than the doping level of the channel-accommodating third region; more preferably still the fourth region has a width which is sufficiently small such that, in operation when the electrical potential of the gate creates a channel in the channel-accommodating third region, the fourth region is fully depleted. Thus the fourth region does not provide a significant deleterious increase in the on-resistance. This advantage may be realised particularly effectively when the fourth region has a width between 25 nm and 50 nm.

Preferably the fourth region extends further from the first major surface than does the gate, and more preferably still the fourth region is aligned to a top of the shield region; alternatively, the fourth region extends further from the first major surface than the shield region: these arrangements provide for particularly effective reduction in the gate-drain capacitance.

Preferably the first conductivity type is n-type and the second conductivity type is p-type. This allows for the use of convenient doping types during the manufacturing process.

According to a further aspect of the invention there is provided a method of manufacturing a TrenchFET comprising the steps, not necessarily in the following order, of defining in a semiconductor body having a first major surface a first and a second region of a first conductivity type and a channel-accommodating third region of a second conductivity type opposite the first conductivity type therebetween, defining a trench extending from the first major surface into the semiconductor body, adjacent the first and channel-accommodating third regions and extending into the second region, forming a gate of electrically conducting material within the trench and spaced apart from the sidewalls and bottom of the trench, forming a shield region of electrically conducting material within the trench and between the gate and bottom of the trench and spaced apart therefrom, characterised in that the method further comprises the step of defining a fourth region of the second conductivity type adjacent the sidewalls of the trench and extending from the channel-accommodating third region towards the bottom of the trench.

Preferably the fourth region is defined by a low angle implant; alternatively, the fourth region may be defined by gaseous vapour phase deposition. These processes allow for convenient and accurate definition of the depth and doping of the fourth region.

Advantageously the step of defining the fourth region may include self-alignment of the fourth region to the top of the shield; this may be effected by carrying out the definition after the step of performing the shield region. This provides a particularly simplified manufacturing process. Alternatively, the fourth region may be defined after the step of defining the trench and before a step of defining a thick oxide layer in the bottom of the trench. This provides for a fourth region which extends throughout the depth of the source electrode.

These and other aspects of the invention will be apparent from, and elucidated with reference to, the embodiments described hereinafter.

BRIEF DESCRIPTION OF DRAWINGS

Embodiments of the invention will now be described, by way of example only, with reference to the following drawings, in which.

The Figures are partly schematic and are not drawn to scale. The same reference numerals are used throughout the figures to denote the same or similar parts.

DETAILED DESCRIPTION OF EMBODIMENTS

Figure 2A:
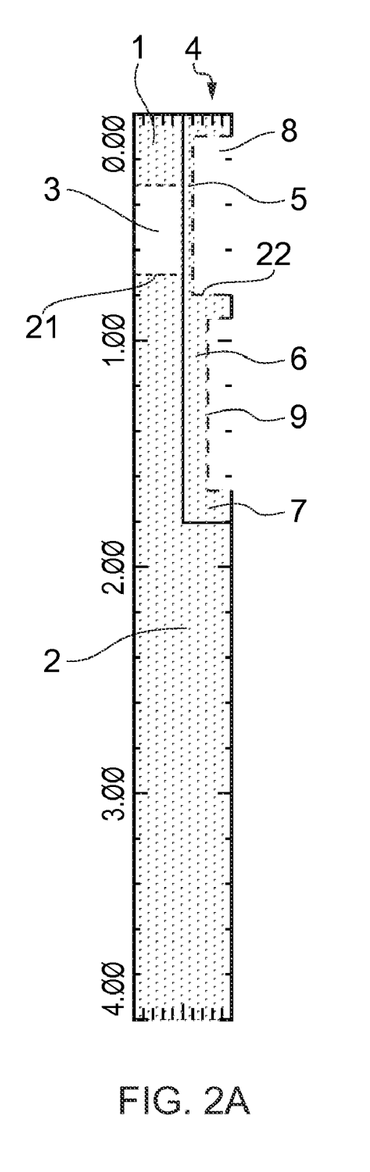
FIGS. 2a and 2b show part of the device of FIG. 1, according to different variations of manufacturing process.
Figure 2B:
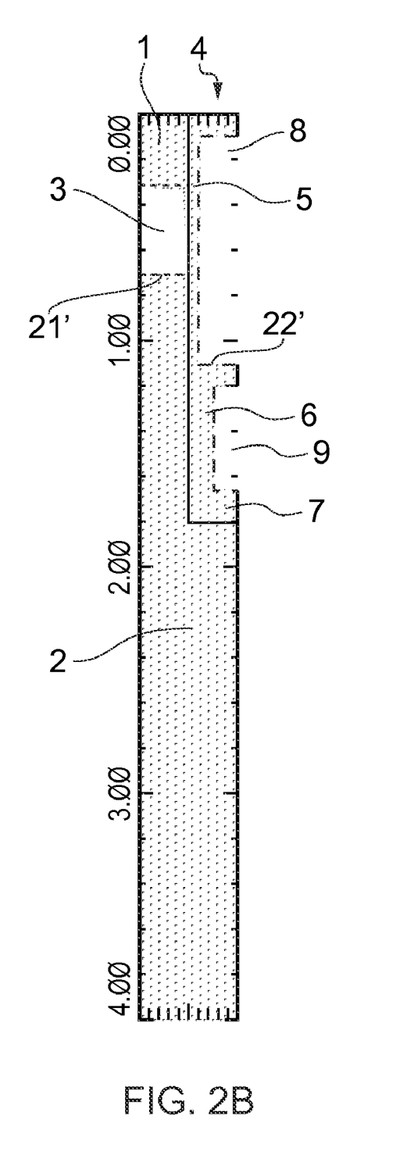

As described above FIG. 1 shows in schematic form part of a conventional split poly TrenchFET. FIGS. 2a and 2b show in more detail the part of the TrenchFET of FIG. 1 depicted within outline 10. Corresponding numerals show the corresponding features of the device as in FIG. 1. Thus the device has source 1 and drain 2 with body region 3 therebetween. Extending into the device is a trench 4. The sidewalls of the trench generally adjacent source and body are lined with gate oxide 5, and the lower part of the sidewalls and the base of the trench are lined with further oxide, which may be known as "thick oxide", 6 and 7 respectively. Polysilicon gate 8 is located generally towards the top of the trench, and shield 9 is located generally towards the bottom of the trench. As shown in the left hand side part of the figure, the junction 21 between body region 3 and drain 2 is closely aligned to the base 22 of the gate polysilicon. Thus there is only a small region of gate 8 which is proximate to the drain 2.

In comparison the right hand part of the figure depicts the same device manufactured to the same design, but with different etch depths and/or layer thicknesses, which may still be within the manufacturing tolerances. In this case the device has a shallower shield region 9 and consequently a deeper gate region 8. The corresponding body/drain boundary 21' is thus further from the base 22' of the gate 8.

In this embodiment the shield 9 is connected to a source electrode (not shown) and provides shielding for the gate from the drain region 2. However, this is only effective if the distance between the body/drain junction 21 and the bottom of the gate electrode 22 is small; as the distance increases the level of shielding the source electrode provides is reduced. If the body/drain junction 21' becomes too distant from the base of the gate electrode 22', the effects include firstly, loss of RESURF leading to a collapse in the breakdown voltage of the device, and secondly, increased switching losses. Although in this embodiment the shield is connected to the source electrode, such a connection is not necessary for putting the invention into practice.

Figure 3:
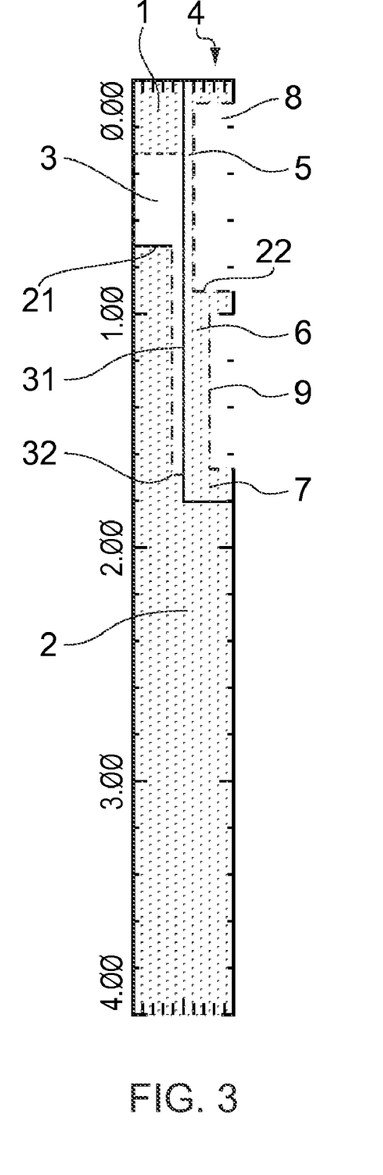
FIG. 3 shows the same part of a TrenchFET according to a first embodiment of the present invention.

Turning now to FIG. 3, this depicts a device according to a first embodiment of the present invention. The device is generally similar to that in FIG. 2. N-type source region 1 is separated from n-type drain region 2, adjacent the trench 4, by p-type body region 3. However a further narrow p-type region 31 extends from body 3 adjacent the trench to a depth 32. The depth 32 generally corresponds to the base of the shield region 9, although region 31 may extend deeper into the device, or not as far as the base of the shield region 9. The narrow, or laterally shallow, region 31 is doped p- (that is, it is doped lightly p-type). Thus the p- region separates the gate oxide 6 from the drain 2 and also separates the bottom portion of gate oxide 5 from the drain 2. The width of the region, that is, the lateral distance it extends from the trench, is small enough so as to ensure that it is fully depleted by an electrical potential on the gate sufficient to form a channel in the body region 3. This region 31 provides further isolation between gate polysilicon 8 and drain 2. In consequence the contribution to the gate-drain capacitance which would otherwise arise from the mismatch in levels between the body/drain junction 21 and the base of the gate electrode 22 is, to a substantial extent, avoided.

Figure 4:
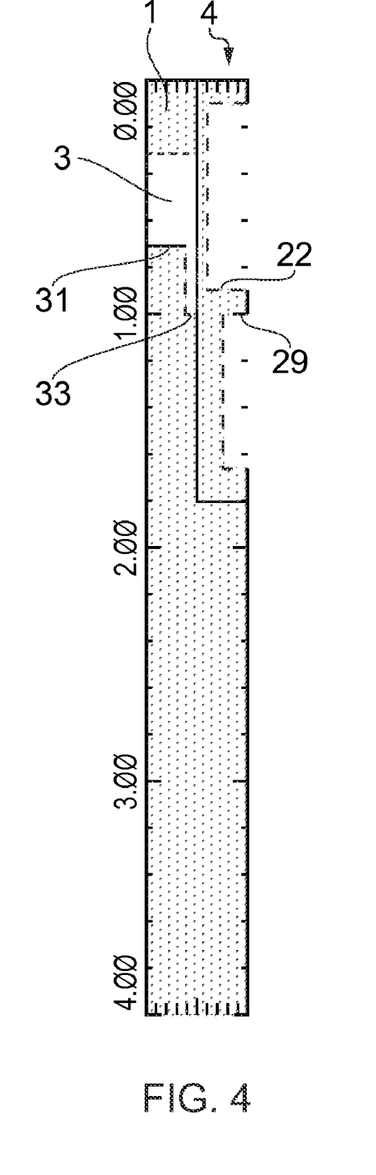
FIG. 4 depicts a TrenchFET according to a second embodiment of the present invention.

A second embodiment of the present invention is depicted in FIG. 4. FIG. 4 depicts a TrenchFET generally similar to that in FIG. 3, however in this embodiment the p- extension 31 to the body region does not go as deeply into the device: instead, it extends to a depth 33 which is generally level with the top 29 of the shield region 9.

Devices according to the invention are manufactured mainly using conventional techniques, which will not be described herein, but will be well known to the person skilled in the art. However, additional process steps are involved, as will be described hereunder. The device is manufactured in an entirely conventional way up to and including the step of defining the trench 4. However prior to the deposition or growth of the thick bottom oxide which will form oxide base 7 and side-wall linings 6, the p- region 31 is introduced. The method of achieving this p- region is not limited, but in illustrative embodiments, it may be defined using a low energy angled boron implant; an alternative illustrative method of defining the region is by gaseous vapour phase deposition. After introduction of the p- region, the thick bottom oxide is deposited or grown conventionally, and the remainder of the device fabrication is entirely conventional. Thus polysilicon shield region 9 is deposited and etched back; thereafter gate oxide 5 is deposited and defined. Gate polysilicon 8 is then grown or deposited. The p-type body 3 and n-type source 1 are then defined, and the remainder of the device processed conventionally.

Devices according to the second embodiment of the invention as depicted in FIG. 4 are fabricated in a similar way. However, in this case the p- region is diffused after the thick bottom oxide (TBO) and the shield region polysilicon are deposited and etched back. As a result the bottom 33 of the p-region 31 is automatically aligned with the top 29 of the shield region 9. The remainder of the process is carried out in an entirely conventional manner as described above.

The p- region 31 is connected to source potential via the body region 3. Correct choice and control of the doping in the p- region is important, in order to avoid any significant reduction in the performance of the device in the on-state. The p-region must be fully depleted by the gate potential in order for current to flow between source and drain in this on-state.

Figure 5:
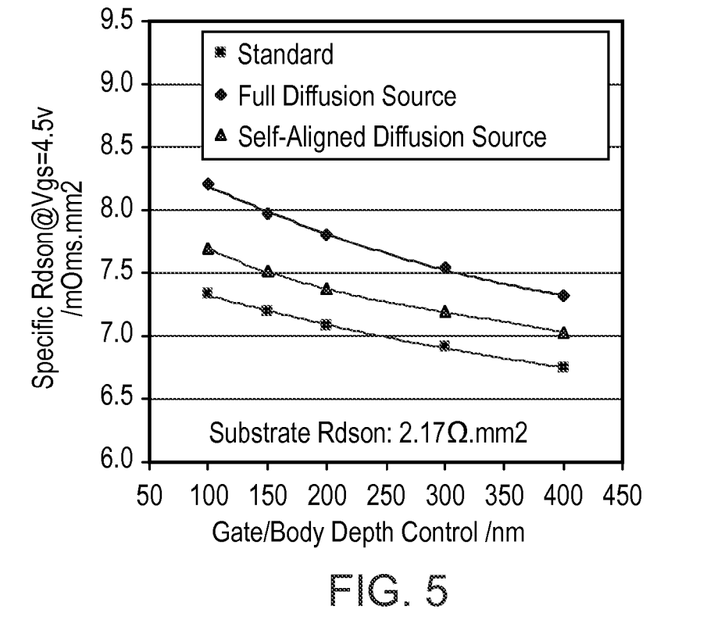
FIG. 5 shows the modelled response of a device according to the first and the second embodiments of the present invention in comparison with a similar standard device. The variation of specific on resistance with the control of the gate/body depth is shown.
Figure 6:
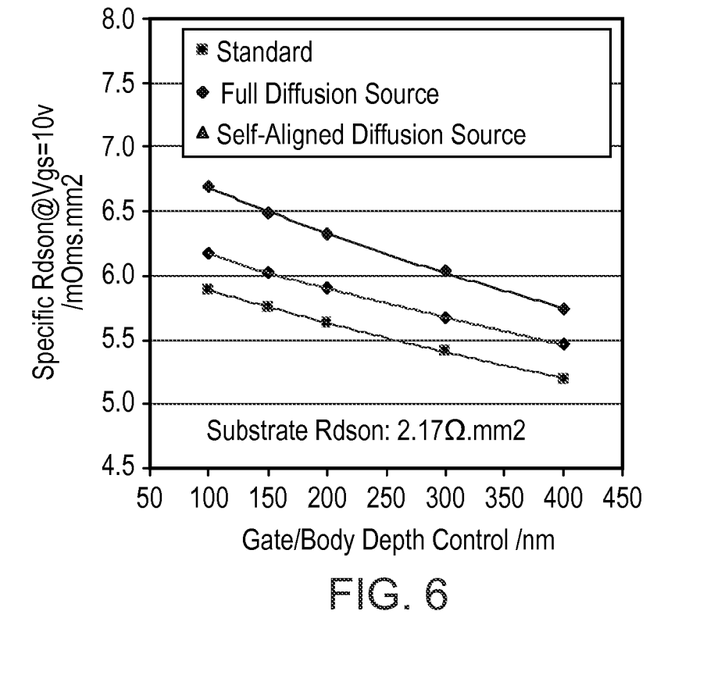
FIG. 6 shows a similar modelled response for a different gate source voltage.

The simulated performances of the first and second embodiments of the invention in comparison with a standard split poly RESURF stepped oxide structure will now be discussed. FIGS. 5 and 6 depict the specific on-resistance of the devices at gate-source voltage (Vgs) of 4.5V and 10V respectively. Each graph shows the variation of the specific on resistance with control of the depth of the gate/body junction 21, for of a conventional device (at 50), an example device according to the first embodiment (at 51), and an example device according to the second embodiment (at 52). As shown, there is a small increase in the specific on-resistance due to the presence of the p- region.

Figure 7:
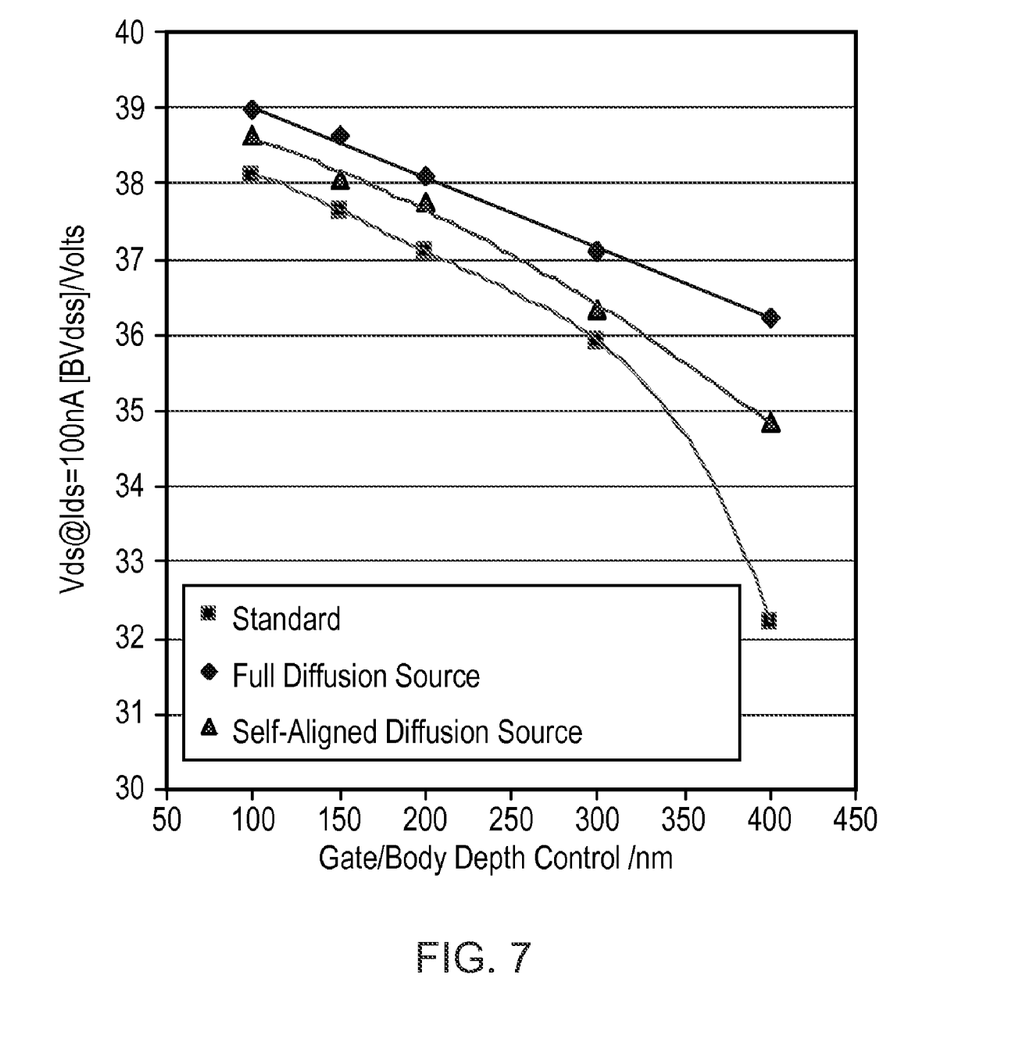
FIG. 7 shows the variation of drain-source voltage (at a specific drain-source current) with control of the gate/body depth for the three devices of FIG. 5.
Figure 8:
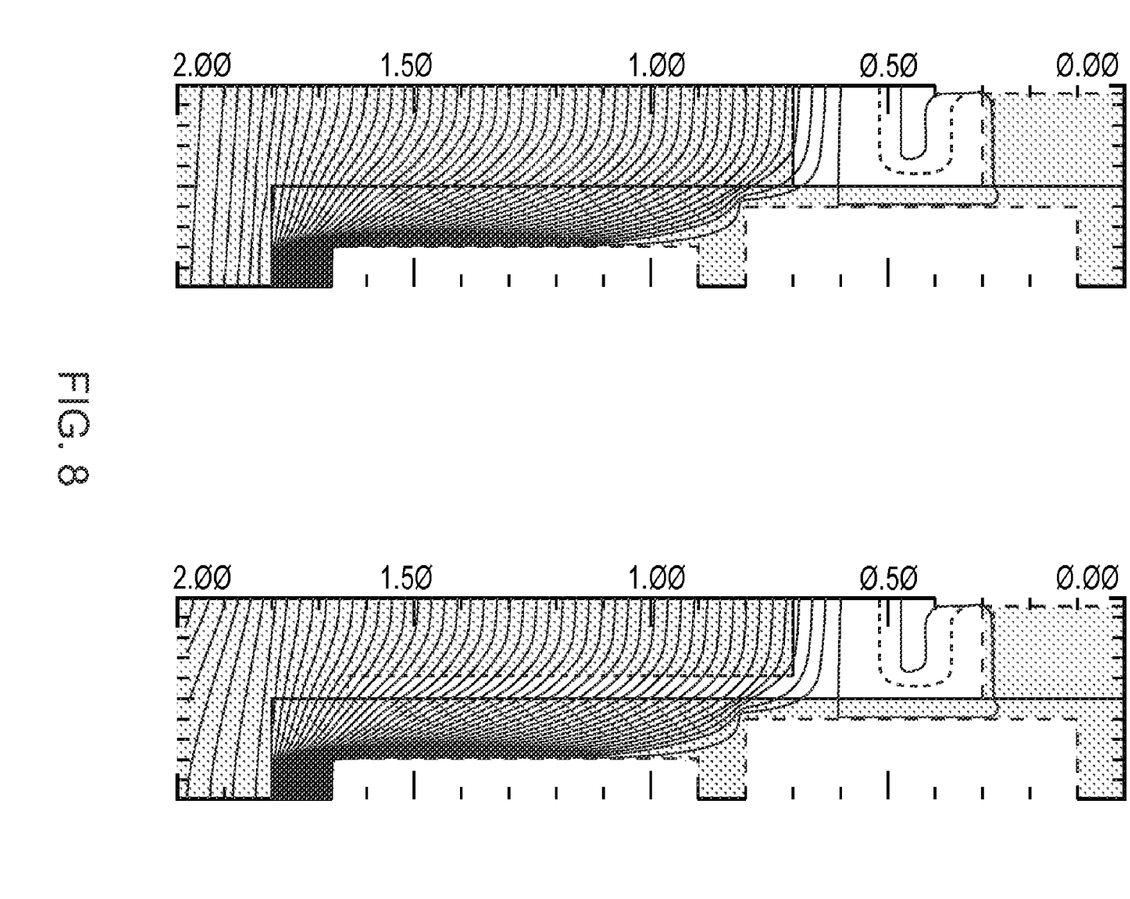
FIG. 8 shows a field distribution for a conventional device and according to the first embodiment of the present invention.
Figure 9:
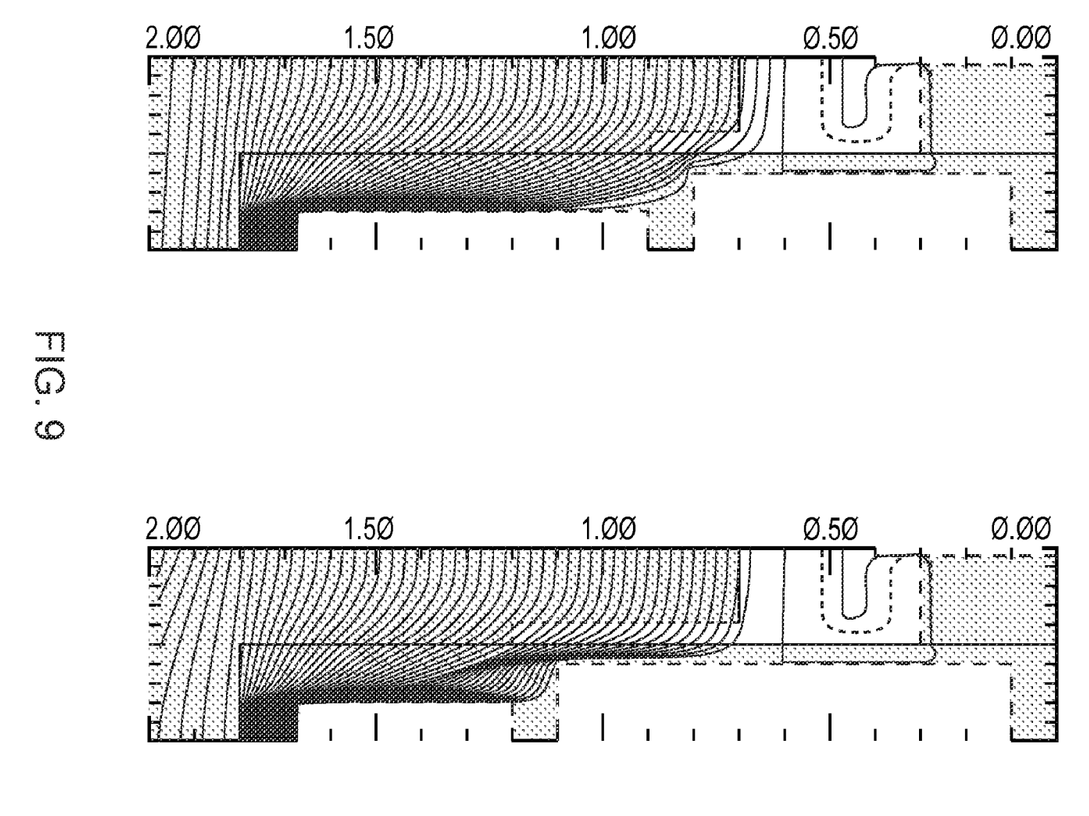
FIG. 9 shows the field distribution for two devices according to the second embodiment of the present invention.

FIG. 7 shows a comparison of breakdown voltage of devices according to embodiments of the invention relative to a standard device. The drain-source voltage (Vds) at a drain-source current of 100 nAmps is plotted against the control of gate/body depth. As shown in the graph, a closer control of the gate/body junction depth is required for standard devices than for devices according to these embodiments. Both embodiments show that the breakdown of voltage reduces linearly with the distance between the body drain junction 21 and gate depth 22. The inclusion of the p- region prevents any loss of RESURF from occurring. Furthermore, the channel depletion at high Vds is less for the embodiments compared with the standard RESURF structure. This would permit the use of shorter channel lengths, which may thus compensate for the slightly higher specific Rdson. FIG. 8 shows the distribution of the electrical field in a device according to the first embodiment, at 8b, in comparison with a conventional device, at 8a, at voltages close to breakdown voltage. FIG. 9 shows the same field distribution for devices according to the second embodiment.

Figure 10:
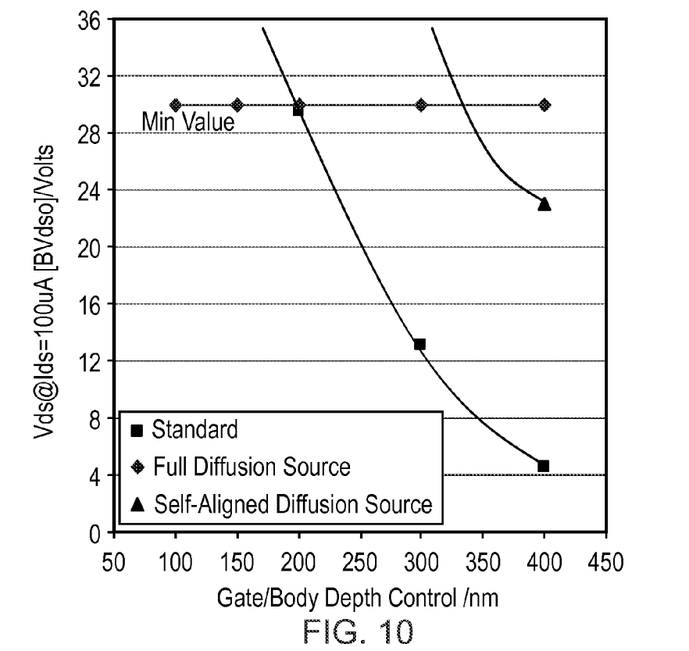
FIG. 10 shows the gate bounce immunity for the three devices of FIG. 5.

FIG. 10 shows the effects of the invention on gate bounce. As those skilled in the art will be aware, gate bounce (sometimes referred to as d(Vds)/dt induced turn on) is a parasitic phenomenon that occurs when a fast Vds transient is applied to a MOSFET such as a Trench-FET in the off state. If the drain voltage of the MOSFET rises quickly then, the voltage across the gate-drain capacitance, Cgd, will also increase rapidly, giving rise to a current in this capacitance. If this current flows into the gate-source capacitance (Cgs) then the gate voltage will rise and if it rises fast enough it will turn on the MOSFET. Note that since the MOSFET is turned off the gate terminal is usually shorted to ground via some gate and MOSFET driver resistance and inductance—this imperfect shorting of the gate means that some of the Cgd capacitive current will always flow into Cgs and the charge then removed by the short. In this way a fast Vds causes a spike on the gate terminal.

Good immunity to gate bounce requires a low Cgd so that the capacitive current is low (since Icgd=Cgd*d(Vds)/dt), and a high Cgs so that it requires a lot of charge to flow into the gate before the voltage on Cgs can rise (Vgs=(integral of Icgd)/Cgs). The ratio of Cgd/Cgs is a convenient measure with low values being good. Since these capacitances are non linear, though, a test called "Vdso" (which is shown in FIG. 10) is useful: leave the gate open and measure the Vds at which the MOSFET starts to turn on. (This has the additional advantage of taking into account the Vt of the device, which is also an important parameter for this effect). The higher the voltage the better: at some point the device will reach the breakdown voltage BVdss and BVdso can no longer be improved.

FIG. 10 shows that for the first embodiment the inclusion of the p- region has desensitised the gate from any gate bounce effects; the line is flat since the model only ramps up to 30V. In the case of the second embodiment there is a substantial improvement in BVdso over the entire process window. Thus the inclusion of the p- region provides a wider process window and more design freedom. The cause of the improved performance is the conversion of Cgd to Cgs.

Figure 11:
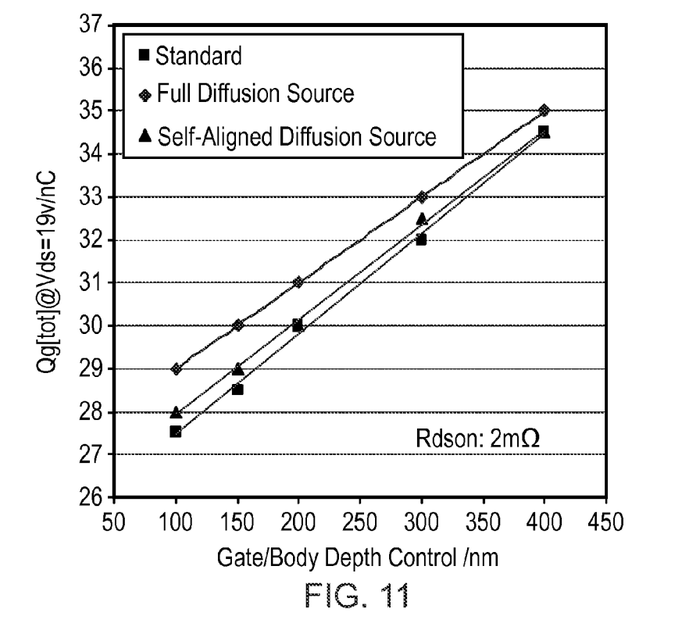
FIG. 11 shows the variation of total gate charge for the three devices of FIG. 5.

FIG. 11 shows the variation of total gate charge (Qg[tot]) with control of the gate body junction depth, for the two embodiments and a standard device at a gate source voltage of 4.5V and with an active area equivalent to 2 mOHM. There is a slightly increased value of Qg[tot], due to the extra gate source capacitance created by the inclusion of the p- region along the gate.

From the simulated results described above it is clear that the embodiments do not produce a significantly negative impact on device performance, and for some parameters, they even improve device performance over a standard conventional device. However, process control of the critical alignment of the body-drain junction 21 to the base 22 of the gate electrode 8 has been significantly relaxed. The benefits of the wider process window may translate into higher production yields or more closely defined device specification.

From reading the present disclosure, other variations and modifications will be apparent to the skilled person. Such variations and modifications may involve equivalent and other features which are already known in the art of Trench-FETs, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub combination.

The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, and reference signs in the claims shall not be construed as limiting the scope of the claims.

The invention claimed is:

1. A Trench field effect transistor (TrenchFET) comprising
a semiconductor body defining a first major surface,
a first and a second region of a first conductivity type,
a channel-accommodating third region therebetween of a second conductivity type opposite the first conductivity type,
a trench extending from the first major surface into the semiconductor body, adjacent the first and channel-accommodating third regions and extending into the second region,
a gate formed of electrically conducting material within the trench and spaced apart from the sidewalls and bottom of the trench,
a shield region formed of electrically conducting material within the trench and between the gate and bottom of the trench and spaced apart therefrom,
wherein the TrenchFET further comprises
a fourth region of the second conductivity type extending adjacent the sidewalls of the trench from the channel-accommodating third region towards the bottom of the trench, wherein the fourth region extends to a depth that is aligned to a top of the shield region, and wherein the fourth region is defined after the shield region is formed.

2. A TrenchFET according to claim 1, wherein the fourth region has a doping level which is lower than the doping level of the channel-accommodating third region.

3. A TrenchFET according to claim 1 wherein the fourth region has a width which is sufficiently small such that, in operation when the electrical potential of the gate creates a channel in the channel-accommodating third region, the fourth region is fully depleted.

4. A TrenchFET according to claim 1 wherein the fourth region has a width between 25 nm and 50 nm.

5. A TrenchFET according to claim 1 wherein the fourth region extends further from the first major surface than does the gate.

6. A TrenchFET according to claim 1 wherein the fourth region extends further from the first major surface than the shield region.

7. A TrenchFET according to claim 1 wherein the first conductivity type is n-type and the second conductivity type is p-type.

8. A method of manufacturing a TrenchFET comprising:
defining in a semiconductor body having a first major surface a first and a second region of a first conductivity type and a channel-accommodating third region of a second conductivity type opposite the first conductivity type therebetween,
defining a trench extending from the first major surface into the semiconductor body, adjacent the first and channel-accommodating third regions and extending into the second region,
forming a gate of electrically conducting material within the trench and spaced apart from the sidewalls and bottom of the trench,
forming a shield region of electrically conducting material within the trench and between the gate and bottom of the trench and spaced apart therefrom,
wherein the method further comprises,
defining a fourth region of the second conductivity type adjacent the sidewalls of the trench and extending from the channel-accommodating third region towards the bottom of the trench, wherein defining the fourth region includes self-aligning the fourth region to the top of the shield, and wherein the fourth region is defined after the step of forming the shield region.

9. A method as claimed in claim 8, wherein the fourth region is defined by an angled implant.

10. A method as claimed in claim 8, wherein the fourth region is defined by gaseous vapour phase deposition.

11. A method as claimed in claim 8, wherein the fourth region is defined after the step of defining the trench and before a step of defining a thick oxide layer in the bottom of the trench.

* * * * *